Figure 1:
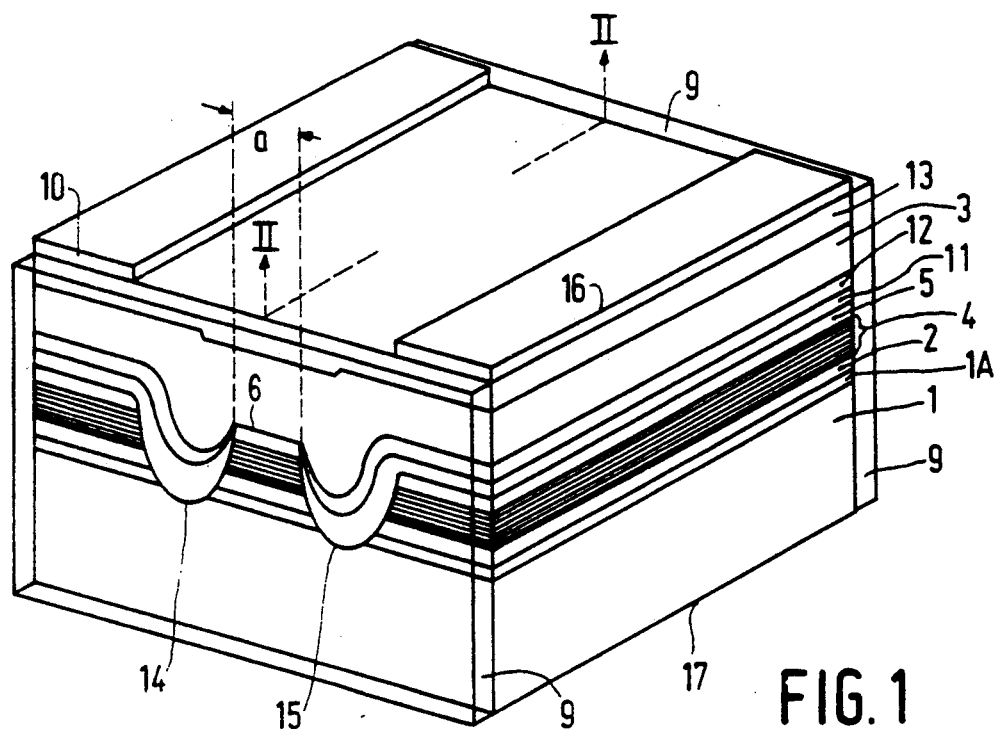

United States Patent [19]
Verbeek et al.

[11] Patent Number: 5,196,958
[45] Date of Patent: Mar. 23, 1993

[54] OPTICAL AMPLIFIER HAVING GAIN AT TWO SEPARATED WAVELENGTHS

[75] Inventors: Bastiaan H. Verbeek; Wilma van Es-Spiekman; Leonardus J. M. Hendrix, all of Eindhoven, Netherlands

[73] Assignee: U.S. Philips Corporation, New York, N.Y.

[21] Appl. No.: 603,977

[22] Filed: Oct. 23, 1990

[30] Foreign Application Priority Data

Oct. 31, 1989 [NL] Netherlands .......................... 8902685

[51] Int. Cl.$^5$ .......................... H01S 3/02; H01S 3/18; G02B 1/10
[52] U.S. Cl. .................................. 359/344; 359/345; 372/45; 257/79; 257/431
[58] Field of Search ...................... 330/4.3; 357/17, 19, 357/30; 372/45, 46, 48; 359/344, 345

[56] References Cited

U.S. PATENT DOCUMENTS

| | | | |
|---|---|---|---|
| 3,868,589 | 2/1975 | Wang | 330/4.3 |
| 4,439,782 | 3/1984 | Holonyak | 357/16 |
| 4,525,687 | 6/1985 | Chemla et al. | 330/4.3 |
| 4,589,115 | 5/1986 | Burnham et al. | 372/20 |
| 4,616,241 | 10/1986 | Biefeld et al. | 372/45 |
| 4,727,555 | 2/1988 | Burnham et al. | 372/45 |
| 4,875,216 | 10/1989 | Thornton et al. | 372/45 |

FOREIGN PATENT DOCUMENTS

| | | |
|---|---|---|
| 0103415 | 3/1984 | European Pat. Off. |
| 0254568 | 1/1988 | European Pat. Off. |
| 0321087 | 6/1989 | European Pat. Off. |

OTHER PUBLICATIONS

Xinming et al; "High Efficiency . . . Tunneling Thin Films"; Sol. Energy Mater., vol. 17, #4, pp. 257-263, Jun. 1988; abst. only provided.

Goodhue et al, J. Voc. Sci. Techn. B, Microelectron. Process, Phenan; vol. 7, #2, pp. 407–411, Apr. 1989.

Technical Digest of The European Conference on Optical Communication, 1987, part III, Post Deadline Papers Helsinki, Sep. 1987, P. J. A. Thijs et al.

IEEE Journal of Quantum Electronics, vol. 24, No. 11 Nov. 1988, IEEE New York, U.S., K. Magari et al Optical Narrow-band Filters Using Optical Amplification . . . .

Patent Abstracts of Japan, vol. 6, No. 195 (P-146) Oct. 5, 1982 and JPA 57 104 902 (Seiko).

*Primary Examiner*—Nelson Moskowitz
*Attorney, Agent, or Firm*—Steven Biren

[57] ABSTRACT

An optical amplifier with a semiconductor body comprising a layer structure grown on a substrate 1 with an active layer 4 situated between two cladding layers (2, 3) with a strip-shaped amplification region bounded by two end surfaces (7, 8) which form the input and output surfaces of the radiation to be amplified. The active layer comprises a number of quantum well (QW) layers 4A with direct band transition, which are separated by barrier layers 4B of a different semiconductor material. The material, the number, and the thickness of the QW layers 4A and the barrier layers 4B in combination with the length 1 of the amplification region are chosen in such a way that two optical transitions can take place in the active layer 4, maximum amplification occurring at a certain current density through the PN junction for the radiation wavelengths corresponding to these optical transitions, while the end surfaces (7, 8) are provided with an anti-reflection layer 9 which has a reflection coefficient R of at most 0.5% for these two wavelengths. An anti-reflection layer made up of four layers of alternately titanium oxide and aluminum oxide is advantageously used.

8 Claims, 2 Drawing Sheets

OPTICAL AMPLIFIER HAVING GAIN AT TWO SEPARATED WAVELENGTHS

The invention relates to an optical amplifier with a semiconductor body comprising a substrate of a first conductivity type and a covering layer structure of at least a first passive layer of the first conductivity type, a second passive layer of the second, opposite conductivity type, and between the first and the second passive layers an active layer and a PN junction, in which amplification of electromagnetic radiation occurs within a strip-shaped amplification region of the active layer at a sufficiently high current strength in the forward direction through the PN junction, in which the active layer for the radiation to be amplified has a greater effective refractive index and a smaller effective band gap than the first and the second passive layer, and in which the active layer consists of a number of quantum well layers (referred to as QW layers for simplicity's sake) of a semiconductor material with a direct energy gap, which layers are separated from one another by barrier layers of another semiconductor material, while the strip-shaped amplification region is bounded by end surfaces which are practically perpendicular to the active layer and serve as input and output surfaces for the radiation to be amplified, the second passive layer and the substrate being electrically connected to connection conductors.

Such a semiconductor device is known from the Japanese Patent Application JP-A-56/164588 (publication date Dec. 17, 1981) laid open to public inspection and published in Patent Abstract of Japan, vol. 6 Apr. 7, 1982, no. 52 (E-100), page 23. Optical radiation amplifiers are widely used in the quickly developing optical communication technology. Wide distances must often be covered and/or strongly ramified networks must be used in optical telecommunication systems. A weak or attenuated optical signal must then often be regenerated by an optical amplifier once or several times underway. Radiation amplification takes place in the active layer in such an amplifier realized by semiconductor technology. This amplification is at its maximum at a wavelength which is determined by the choice of semiconductor material of the active layer and by the Fabry-Pérot (FP) resonances, which in their turn are determined by the positions of the end surfaces. If these end surfaces are made non-reflecting or practically non-reflecting by means of an anti-reflection layer, an optical amplifier of the travelling wave type is obtained with a relatively wide-band amplification profile which is determined exclusively by the material amplification.

At the moment two wavelength ranges or windows are important in the field of optical communication, i.e., those between approximately 1280 nm and 1320 nm and between approximately 1500 nm and 1570 nm. Outside these windows the absorption in the usual optical fibres is too high.

The bandwidth of the known optical travelling wave amplifiers described above is in the order of 60 nm. So a bandwidth of 60 nm is insufficient for systems in which both wavelength windows mentioned must be used, which is the case, for example, in the application of multiplex techniques such as in "Local Area Networks", in which information is transmitted via both wavelength windows through the same optical fibre. This means that separate optical amplifiers are required for the regeneration of attenuated signals in this case.

The present invention has for its object inter alia to provide an optical travelling wave amplifier in which radiation amplification for both wavelength windows can take place in one and the same element.

The invention is based on the recognition that this can be achieved by means of a suitably chosen structure of the active layer built up of quantum wells.

To achieve the object, an optical amplifier of the type described in the opening paragraph is characterized in that the material, the number and the thickness of the quantum well layers and the barrier layers in combination with the length of the strip-shaped amplification region are so chosen that two optical transitions between the conduction band and the valency band can take place in the active layer, maximum amplification taking place at a certain current density through the PN junction for the radiation wavelengths corresponding to these optical transitions, and in that the end surfaces are provided with an anti-reflection layer which has a reflection coefficient of at most 0.5% for these two wavelengths.

Since only one optical amplifier element need be used for each regeneration in systems in which multiplex techniques via two wavelength windows are used, according to the invention, this leads to a considerable simplification for such systems, and consequently to a major cost reduction.

In view of the absorption characteristics of the presently available optical fibres, as stated above, the two radiation wavelengths having maximum amplification lie preferably between 1280 nm and 1320 nm, and between 1500 nm and 1570 nm.

Various suitable materials may be used for the QW layers and the barrier layers. Good results are obtained when the QW layers consist of indium-gallium-arsenic phosphide (InGaAsP) and the barrier layers of indium phosphide (InP). Six QW layers, each with a thickness of approximately 9 nm, are advantageously used for this in combination with barrier layers having a thickness of approximately 20 nm.

As noted above, the end surfaces must be coated with an anti-reflection layer resulting in a reflection coefficient of at most 0.5% for both wavelengths. The application of an anti-reflection layer meeting this specification is not always simple. According to the invention, the envisaged effect can be achieved with an anti-reflection layer consisting of N layers, alternately a first layer of a first material and a first, higher refractive index $n_1$, and a second layer of a second material having a second, lower refractive index $n_2$, the optical thickness of each layer being substantially equal to ¼ the average wavelength of the radiation to be amplified, and the relation between the number N, the refractive index $n_1$ of the first layers and the refractive index $n_2$ of the second layers being given by the $$N = 1 + 2 \times \frac{(n_1 + n_2)}{(n_1 - n_2)} \times \frac{(n_2 - n_1)}{(n_2 + n_1)}$$

in which the value $n_1 \times n_2$ is substantially equal to the effective refractive index of the waveguide structure of the amplifier.

The first layer of anti-reflection layers applied on III-V junctions advantageously consist of titanium dioxide ($TiO_2$), and the second layers of aluminum oxide ($Al_2O_3$) in order to obtain minimum reflection in the said wavelength ranges.

In certain conditions, an accurate mutual adaptation of the various refractive indices may be obtained when at least one of the two materials of the anti-reflection layer consists of silicon oxynitride ($SiO_xN_y$). This is because the refractive index of this material can be varied within certain limits by adjustment of the ratio between oxygen and nitrogen.

Figure 2:
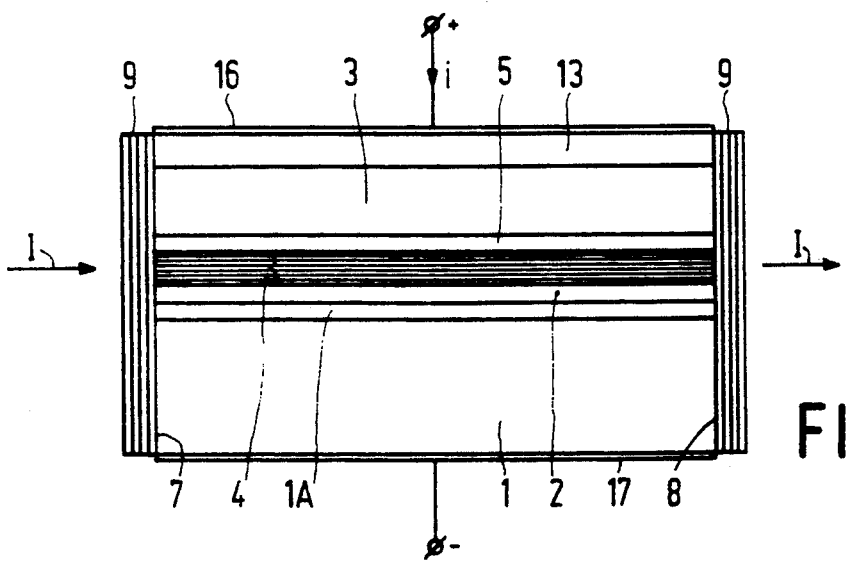
Figure 3:
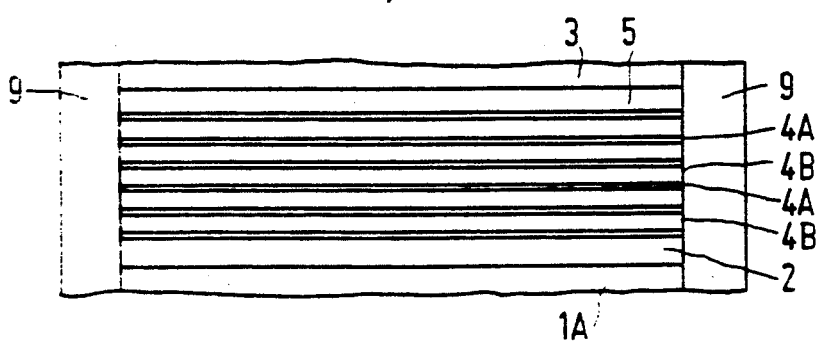
Figure 4:
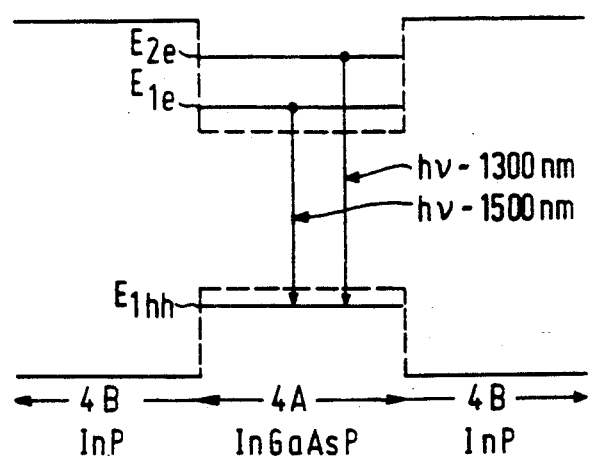
Figure 5:
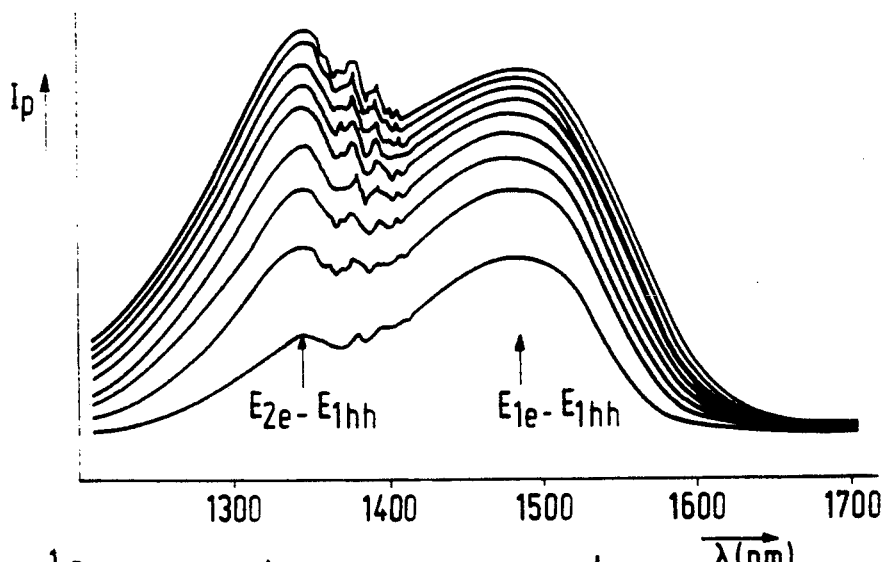
Figure 6:
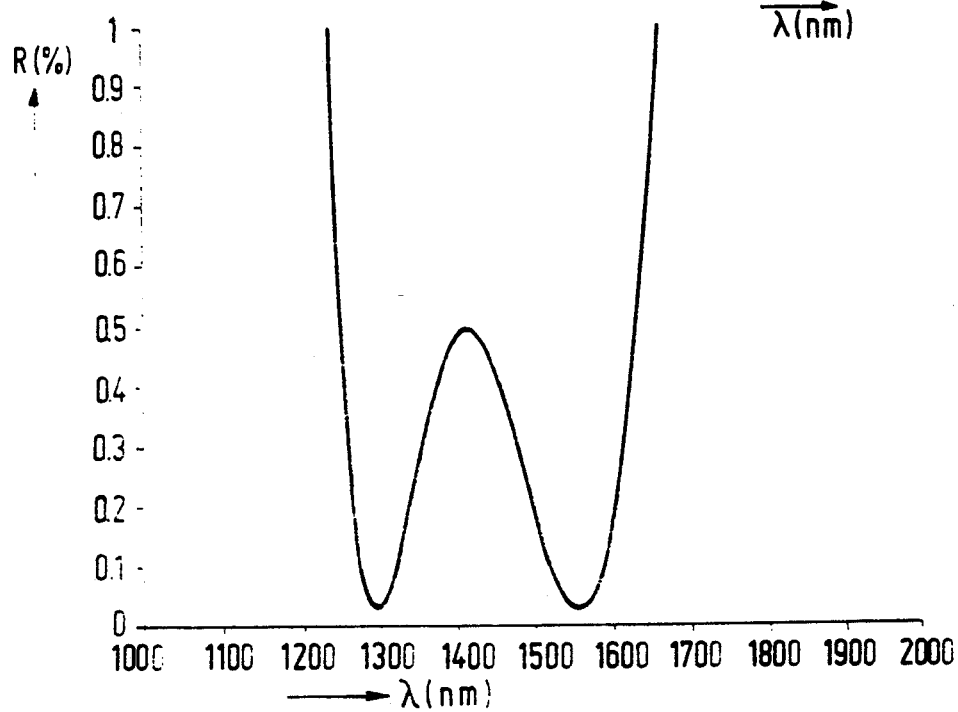

The invention will now be explained in more detail with reference to an embodiment and the drawing, in which FIG. 1 diagrammatically shows an optical amplifier according to the invention, partly in perspective view and partly in cross-section, FIG. 2 diagrammatically shows a cross-section taken on the line II—II of FIG. 1, FIG. 3 shows a more detailed cross-section of the active layer of the device, FIG. 4 diagrammatically shows the energy diagram of the active layer with the possible optical electron transitions, FIG. 5 shows the photoluminescence spectrum of the optical amplifier according to FIG. 1, and FIG. 6 shows the reflection coefficient R as a function of the wavelength for the anti-reflection layer used.

The Figures are diagrammatical and not drawn to scale, especially the dimensions in the thickness direction being strongly exaggerated for greater clarity. Corresponding parts are generally indicated with the same reference numerals.

FIG. 1 shows diagrammatically, partly in perspective and partly in cross-section, and FIG. 2 shows diagrammatically in cross-section taken on the line II—II of FIG. 1 an optical amplifier according to the invention. The device has a semiconductor body comprising a substrate 1 of a first conductivity type, in this case the N-conductivity type, and a covering layer structure. This layer structure comprises an N-type buffer layer 1A, a first conductivity type passive layer 2 of the said first, so in this case N-conductivity type, a second passive layer 3 of the second, opposite conductivity type, so in this case the P-type, and between the first passive layer 2 and the second passive layer 3 an active layer 4, in this case of the N-type. The said layer structure further comprises a PN junction 6 between the passive layers 2 and 3. In this embodiment this PN junction 6 adjoins the P-type layer 3. The materials and dimensions of the layers of the said layer structure are chosen in such a way that amplification of electromagnetic radiation (I) takes place within a strip-shaped amplfiication region of the active layer 4 for certain wavelengths at a sufficiently high current strength (i) in the forward direction through the PN junction.

The active layer 4 for the radiation I to be amplified here has a greater effective refractive index and a smaller band gap than the first (2) and second (3) passive layers, while the active layer 4 comprises a number of quantum well (QW) layers 4A of a semiconductor material with direct band transition, which layers are separated from one another by barrier layers 4B of a different semiconductor material. The strip-shaped amplification region, whose width is diagrammatically indicated with a in FIG. 1, is bounded by end surfaces 7 and 8 which are practically perpendicular to the active layer as serve as input and output surfaces for the radiation I to be amplified. The second passive layer 3 and the substrate 1 are electrically connected to connection conductors in the form of metal layers 16 and 17, through which a current i can be supplied in the forward direction to the PN junction 6.

According to the invention, the material, the number, and the thickness of the QW layers 4A and the barrier layers 4B in combination with the length 1 (see FIG. 2) of the strip-shaped amplification region are chosen in such a way that two optical electron transitions can take place in the active layer 4 between the conduction band and the valency band, maximum amplification occurring at a certain current density through the PN junction 6 for the radiation wavelengths corresponding to these optical transitions, while the end surfaces 7 and 8 (see FIG. 2) are each provided with an anti-reflection layer 9 which has a reflection coefficient of at most 0.5% for these two wavelengths.

In view of the characteristics of the available optical fibres, as noted above, it is preferably ensured that maximum amplification takes place both for wavelengths between 1280 nm and 1320 nm and for wavelengths between 1500 nm and 1570 nm.

This is realized in the following way in the present embodiment. The active layer 4 (shown in more detail in FIG. 3) comprises 6 QW layers 4A of N-type indium-palladium-arsenic phosphide in the composition $In_{0.58}Ga_{0.42}As_{0.90}P_{0.10}$ and with a thickness of approximately 9 nm. If used as a single active laser layer, this material has an emission wavelength of 1.55 μm. The QW layers 4A are separated from one another by barrier layers of N-type indium phosphide with a thickness of approximately 20 nm.

An active layer composed in this way leads to an energy diagram as represented in FIG. 4. Two different optical electron transitions, i.e. between the levels $E_{2e}$ and $E_{1hh}$ and between the levels $E_{1e}$ and $E_{1hh}$, can take place with radiation wavelengths of approximately 1300 nm and approximately 1500 nm, respectively, in a quantum well enclosed by two InP layers. The relative positions of the two levels $E_{2e}$ and $E_{1e}$ can be adjusted within certain limits by variation of the thickness of the QW layers. The number of QW layers in combination with the length 1 of the active strip-shaped region, which is 250 μm in this embodiment, determines the relative amplification of the wavelengths corresponding to the two optical transitions, the saturation effects occurring for the $E_{1e}$-$E_{1hh}$ transition for certain injection current densities being utilized.

Obviously, in an optical amplifier with such a wide wavelength range, anti-reflection layers must be used which are also effective for both wavelengths. This will be further discussed later.

The optical amplifier of this example has the well-known DCPBH ("Double Channel Planar Barrier Heter") structure which is frequently used for optical communication. The invention, however, is by no means limited to this structure.

The DCPBH structure of the optical amplifier according to this embodiment comprises a substrate 1 of N-type indium phosphide (doping concentration, for example, $5 \times 10^{18}$ cm$^{-3}$) with a thickness of, for example, 350 μm. By means of known growing techniques from the liquid and/or gas phase are provided on this: a buffer layer 1A of N-type indium phosphide with a thickness of 100 nm and a doping concentration of $10^{15}$ cm$^{-3}$, a first passive layer 2 of N-type indium-gallium-arsenic phosphide with the composition $In_{0.73}Ga_{0.27}As_{0.59}P_{0.41}$, a doping concentration of $10^{15}$ cm$^{-3}$ and a thickness of approximately 80 nm, the QW and barrier layers 4A, B, and on top of that a buffer layer 5 of N-type indium-gallium-arsenic phosphide with the composition $In_{0.73}Ga_{0.27}As_{0.59}P_{0.41}$, a doping concentration of $10^{15}$ and a thickness of 80 nm, a second passive layer 3 of P-type indium phosphide with a doping concentration of $10^{18}$ cm$^{-3}$ and a thickness of 1 μm, and a P+ contact layer 13 of $In_{0.72}Ga_{0.28}As_{0.60}P_{0.40}$ with a doping concentration of approximately $10^{19}$ cm$^{-3}$.

The device further comprises a current-limiting layer structure. This structure comprises two grooves 14 and 15 which delimit the strip-shaped amplification region and in which a layer 11 of P-type indium phosphide with a thickness (outside the grooves) of approximately 0.3 μm and a doping concentration of $2 \times 10^{18}$ cm$^{-3}$ and a blocking layer 12 of N-type indium phosphide with a doping concentration of approximately $10^{18}$ cm$^{-3}$ and a thickness of approximately 0.5 μm are provided. The layers 11 and 12 do not extend over the strip-shaped portion of the layer 5 present between the grooves 14 and 15, so that the P-type second passive layer 3 in the mesa-shaped amplification region between the grooves 14 and 15 (width of mesa 1.7 μm) directly adjoins the N-type buffer layer 5. Over the top layer 13 is further provided a silicon oxide layer 10, in which a longitudinal opening is formed, within which an electrode layer 16 applied on the upper surface makes contact with the layer 13. The manufacture of such a DCPBH structure is described in detail inter alia in the European Patent Application by Applicant a published under number EP 259919, so that further discussion is not necessary here.

FIG. 5 shows the photoluminescence spectrum for the optical amplifier according to this embodiment. The photoluminescent intensity (arbitrary units) at 300 K as a function of the wavelength in nm is shown for various values of the injection current i. Such a wide wavelength range, with optimal amplification being possible for two comparatively far removed wavelengths in one and the same amplifier, cannot be bridged by devices having a single active layer.

As said before, an optical amplifier according to the invention can function correctly only if an anti-reflection layer is applied both on the input surface and on the output surface, which layer reduces to an acceptable minimum the reflection of both wavelengths to be amplified. This cannot be realized with a single anti-reflection layer on the III-V materials having high refractive indices, between approximately 3,15 and 3,60, used in laser and amplifier technology.

According to the invention, a satisfactory solution can be achieved through the application of an anti-reflection layer consisting of N layers, alternately a first layer of a first material and a first, higher refractive index $n_1$, and a second layer of a second material having a second, lower refractive index $n_2$, the optical thickness of each layer being substantially equal to ¼ the average wavelength of the radiation to be amplified, and the relation between the number N, the refractive index $n_1$ of the first layers and the refractive index $n_2$ of the second layers being given by the equation:

$$N = 1 + 2 \times \frac{(n_1 + n_2)}{(n_1 - n_2)} \times \frac{(n_2 - n_1)}{(n_2 + n_1)}$$

in which the value $n_1 \times n_2$ is substantially equal to the effective refractive index of the waveguide structure of the amplifier.

It can be calculated in a first approximation, disregarding multiple reflections, that in this case the reflection coefficient R can be kept below 0,5% over a wide wavelength range.

A few solutions of the above equation (for an effective refractive index of the waveguide structure of the amplifier of approximately 3,25) are given in the following table:

| N | $n_1$ | $n_2$ |
|---|---|---|
| 2 | 2,42 | 1,34 |
| 4 | 2,08 | 1,56 |
| 6 | 1,98 | 1,64 |
| 8 | 1,93 | 1,68 |
| 16 | 1,87 | 1,74 |
| 68 | 1,81 | 1,80 |
| ∞ | $\sqrt{3,25}$ | $\sqrt{3,25}$ |

Since the refractive index values 2,08 and 1,56 correspond substantially to those of titanium dioxide ($TiO_2$) and aluminum oxide ($Al_2O_3$), respectively, a good result can be obtained with an anti-reflection layer 9 consisting of four layers, i.e. alternately a layer of $TiO_2$ and a layer of $Al_2O_3$, each layer having an optical thickness of approximately ¼ wavelength, see FIG. 2.

FIG. 6 shows the reflection coefficient as a function of wavelength for such an anti-reflection layer. Multiple reflections have been included in the calculations for this Figure. It can be seen that the reflection coefficient in this case shows minima exactly near the desired wavelengths. This renders this anti-reflection coating eminently suitable for use in the optical amplifier according to the invention.

It should be noted that a very suitable material for at least one of the constituent layers of the anti-reflection layer can be formed by silicon oxynitride. The refractive index can be varied between approximately 1,44 and approximately 2,05 in that case by adjustment of the oxygen/nitrogen ratio, so that a very good control of the desired reflection coefficient is possible.

The use of the anti-reflection layer structure described above is obviously not limited to optical amplifiers, but may also be of advantage in all those cases where an anti-reflection layer with a wide effective window is required.

The invention is not limited to the embodiment described herein, but can be used in other amplifier structures than those of the DCPBH type. Moreover, other dimensions, materials, and layer thicknesses may be used, if so desired, depending on the values of the two wavelengths used, without departing from the scope of the invention.

We claim:

1. An optical amplifier comprising:
    a substrate of a first conductivity type;
    a strip shaped amplification region on the substrate, the amplification region including:
        a covering layer including at least a first passive layer of the first conductivity type;
        a second passive layer of a second, opposite conductivity type;
        a PN junction between the first and second passive layers;
        an active layer disposed between the first and the second passive layers, the active layer consisting of a plurality of quantum well layers of a semiconductor material with direct band transition, which layers are separated from one another by barrier layers of another semiconductor material, the number and thickness of the quantum well layers and the barrier layers and the length of the strip shaped amplification region selected so that two optical transitions can take place between a conduction band and two valancy bands in the active layer, the amplification region being operative at a current density through the PN junction sufficient to produce saturation effects for at least one of said two optical transitions to amplify radiation at two wavelengths corresponding to the two optical transitions;

end surfaces bounding the active layer of the strip shaped amplification region, the end surfaces being practically perpendicular to the active layer and forming input and output surfaces for radiation to be amplified;

connection conductors on the second passive layer and the substrate; and anti-reflection layers on end surfaces of the amplifier having a reflection coefficient of at most 0.5 for the two wavelengths.

2. An optical amplifier as claimed in claim 1, characterized in that the two radiation wavelengths with maximum amplification lie between 1280 nm and 1320 nm and between 1500 nm and 1570 nm, respectively.

3. An optical amplifier as claimed in claim 1, characterized in that the QW layers consist of indium-gallium-arsenic phosphide (InGaAsP) and that the barrier layers consist of indium phosphide (InP).

4. An optical amplifier as claimed in claim 3, characterized in that the number of QW layers is six, that the thickness of the QW layers is approximately 9 nm, and that the thickness of the barrier layers is approximately 20 nm.

5. An optical amplifier as claimed in claim 1, characterized in that an anti-reflection layer consisting of N layers, alternately a first layer of a first material and a first, higher refractive index $n_1$, and a second layer of a second material having a second, lower refractive index $n_2$, the optical thickness of each layer being substantially equal to ¼ the average wavelength of the radiation to be amplified, and the relation between the number N, the refractive index $n_1$ of the first layers and the refractive index $n_2$ of the second layers being given by the equation:

$$N = 1 + 2 \times \frac{(n_1 + n_2)}{(n_1 - n_2)} \times \frac{(n_2 - n_1)}{(n_2 + n_1)}$$

in which the value $n_1 \times n_2$ is substantially equal to the effective refractive index of the waveguide structure of the amplifier.

6. An optical amplifier as claimed in claim 5, characterized in that the first layers consist of titanium dioxide and the second layers of aluminum oxide.

7. An optical amplifier as claimed in claim 5, characterized in that at least one of the two materials is formed by silicon oxynitride, the refractive index of which is determined by the chosen ratio between oxygen and nitrogen in the silicon oxynitride.

8. An optical amplifier as claimed in claim 5, characterized in that the number N is four.

* * * * *